(12) United States Patent
Chiang et al.

(10) Patent No.: US 8,084,320 B2
(45) Date of Patent: Dec. 27, 2011

(54) NON-VOLATILE MEMORY AND METHOD FOR FABRICATING THE SAME

(75) Inventors: Lu-Ping Chiang, Hsinchu (TW); Hsiu-Han Liao, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 296 days.

(21) Appl. No.: 12/501,634

(22) Filed: Jul. 13, 2009

(65) Prior Publication Data

US 2011/0006356 A1   Jan. 13, 2011

(51) Int. Cl.
*H01L 21/336* (2006.01)
*H01L 21/331* (2006.01)
(52) U.S. Cl. .. 438/233; 438/259; 438/366; 257/E21.619
(58) Field of Classification Search ................ 438/233, 438/306, 366, 259; 257/E21.619
See application file for complete search history.

(56) References Cited

U.S. PATENT DOCUMENTS

| 6,204,128 | B1 * | 3/2001 | Hibi et al. | 438/270 |
|---|---|---|---|---|
| 6,214,677 | B1 * | 4/2001 | Lee | 438/284 |
| 6,251,711 | B1 * | 6/2001 | Fang et al. | 438/142 |
| 6,383,921 | B1 * | 5/2002 | Chan et al. | 438/649 |
| 6,930,030 | B2 * | 8/2005 | Rausch et al. | 438/589 |
| 7,129,143 | B2 * | 10/2006 | Park | 438/305 |
| 2001/0055842 | A1 * | 12/2001 | Uh et al. | 438/183 |

\* cited by examiner

*Primary Examiner* — Lex Malsawma
(74) *Attorney, Agent, or Firm* — J.C. Patents

(57) ABSTRACT

A non-volatile memory is described, which includes gate structures, doped regions, second spacers and contact plugs. The gate structures are disposed on the substrate, each of which includes a control gate and a gate dielectric layer. The control gates are disposed on the substrate, and two first spacers are deployed at both sides of each control gate. The gate dielectric layers are disposed between the control gates and the substrate, respectively. Each of the doped regions is formed in the substrate between two adjacent gate structures. The second spacers are disposed on the sidewalls of the gate structures. The contact plugs are formed between two adjacent second spacers, respectively.

9 Claims, 4 Drawing Sheets

NON-VOLATILE MEMORY AND METHOD FOR FABRICATING THE SAME

BACKGROUND OF THE INVENTION

1. Field of the Invention

The present invention generally relates to a semiconductor device and a fabricating method thereof, and in particular, to a non-volatile memory and a fabricating method thereof.

2. Description of Related Art

A memory is a semiconductor device designed for storing information or data. As the functions of computer microprocessors become more and more powerful, programs and operations executed by software are increasing correspondingly. Along with wide applications of consumer electronics and system products, the demands for memory with low power-consuming, low cost, high reading and erasing speed, small volume and high capacity grow rapidly. For this reason, integrating devices with various functions into a single semiconductor substrate comes with the tide of fashion. An embedded non-volatile memory including integrating a non-volatile memory and logic circuits into a single die is one of examples.

In logic circuits, the non-volatile memory is usually included therein besides the circuit devices for memory control and operation. In general, the gate structure of the non-volatile memory is formed by photolithography and etching processes to pattern the conductive material.

Along with rapid progress of semiconductor technology, the dimensions of semiconductor devices are reduced and the integrity thereof is promoted continuously to further advance the operating speed and performance of the integrated circuit. Hence, as the demand for device integrity is raised, how to make the non-volatile memory in a limited area by simplified fabrication and less utilization of mask has to be considered in the recent semiconductor technology.

SUMMARY OF THE INVENTION

Accordingly, the present invention is directed to a method for fabricating a non-volatile memory, which is a gate last process.

The present invention is directed to a non-volatile memory with smaller memory cells in size.

The method for fabricating the non-volatile memory of the present invention is described as follows. A substrate is provided, and a patterned mask layer is formed on the substrate, wherein the patterned mask layer has a plurality of openings. A plurality of first spacers is formed on sidewalls of the patterned mask layer in the openings. A gate dielectric layer is then formed on the substrate between two adjacent first spacers in each of the openings. A conductive layer is formed on the substrate, wherein the conductive layer at least fills the openings and covers the first spacers. The conductive layer is planarized, so as to form a plurality of gate structures. Afterwards, the patterned mask layer is removed, and a doped region is formed in the substrate between two adjacent gate structure. A plurality of second spacers is formed on sidewalls of gate structures. A contact plug is formed between two adjacent second spacers.

The non-volatile memory of the present invention is also described, which includes gate structures, doped regions, second spacers and contact plugs. The gate structures are disposed on the substrate, each of which includes a control gate and a gate dielectric layer. The control gates are disposed on the substrate, and two first spacers are deployed at both sides of each control gate. The gate dielectric layers are disposed between the control gates and the substrate, respectively. Each of the doped regions is formed in the substrate between two adjacent gate structures. The second spacers are disposed on the sidewalls of the gate structures. The contact plugs are formed between two adjacent second spacers, respectively.

As mentioned above, the method for fabricating the non-volatile memory of the present invention is implemented by forming first spacers in the openings, and planarizing the conductive layer which fills the openings, so as to form the gate structures and facilitate dimensions of each memory cell miniaturized. In addition, the self-aligned contact is formed between two adjacent second spacers, and thereby the defects caused by process mistake can be avoided to guarantee the quality of device.

Further, the non-volatile memory of the present invention includes smaller memory cells in size owing to the disposition of the first spacers in the recesses at both sides of each control gate.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
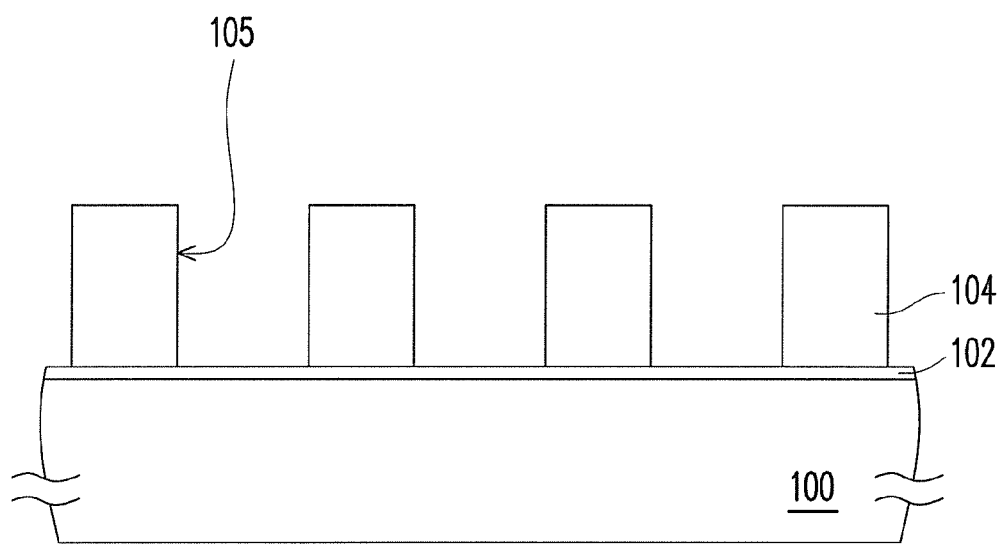
FIGS. 1A-1H depict, in cross-sectional view, a method for fabricating a non-volatile memory according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1H depict, in cross-sectional view, a method for fabricating a non-volatile memory according to an embodiment of the present invention.

Referring to FIG. 1A, a substrate 100 is provided, which may be a semiconductor substrate such as N- or P-type silicon substrate, III-V semiconductor substrates. In general, the substrate 100 includes a main device region and a peripheral circuit region. Among the semiconductor process, a memory process is performed in the main device region, and a logic process is performed in the peripheral circuit region, for example. It is noted that the following embodiments in which the non-volatile memory is formed in the logic process is provided for illustration purposes, and should not be construed as limiting the scope of the present invention.

Referring to FIG. 1A, a pad layer 102 and a patterned mask layer 104 are formed in turn on the substrate 100. The material of the pad layer 102 can be silicon oxide, and the forming method thereof is thermal oxidation or chemical vapour deposition (CVD). The patterned mask layer 104 provides openings 105 to expose partial surface of the pad layer 102. The material of the patterned mask layer 104 may be silicon nitride. The formation of the patterned mask layer 104 is carried out by forming a mask material layer (not shown) on the substrate 100 by chemical vapour deposition then followed by a photolithography process, an etching process to remove a part of the mask material layer.

In this step, it is noted that the openings 105 among the patterned mask layer 104 are designed according to the region of gate structures to be formed, which means that the gate structures are formed at the position of the openings 105 in the following steps.

Figure 1B:
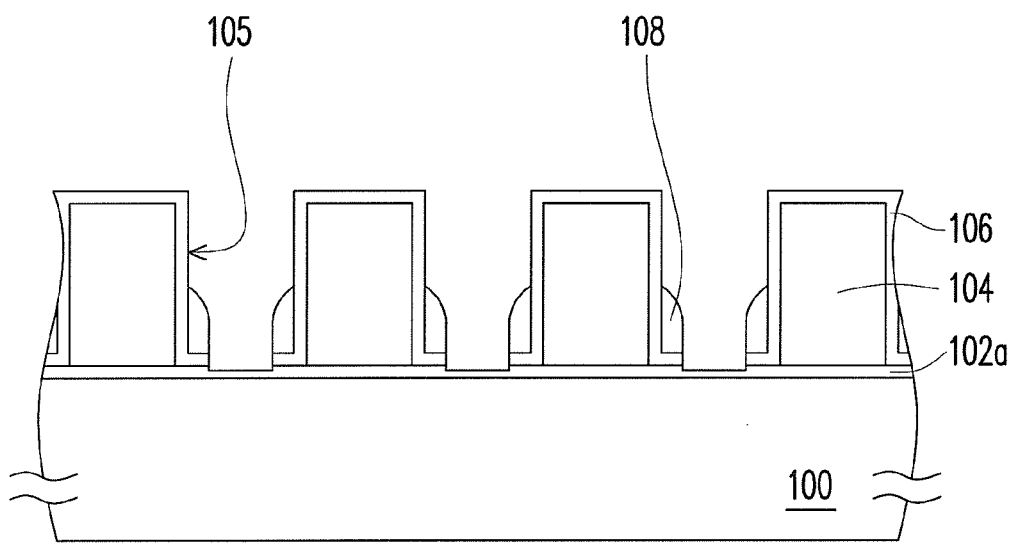

Referring to FIG. 1B, a high temperature oxide (HTO) layer 106 is formed on the substrate 100. The high temperature oxide layer 106 covers on the pad layer 102 and the patterned mask layer 104 conformably. The formation method of the high temperature oxide layer 106 is, for example, thermal oxidation. Afterward, first spacers 108 are formed on the sidewalls of the patterned mask layer 104 in the openings 105. The top surface of the first spacers 108 is lower than that of the patterned mask layer 104. The material of the first spacers 108 could be charge-trapping material which makes charge be trapped, such as silicon nitride, tantalum silicon oxide, strontium silicon titanate, or hafnium silicon oxide. The formation method of the first spacers 108 is implemented by forming a charge-trapping material layer (not shown) filling the openings 105 on the substrate 100 by CVD, followed by an anisotropic etching process to remove a part of the charge-trapping material layer, and then the spacer structure is formed on the sidewalls of the patterned mask layer 104. The removal of a part of the charge-trapping material layer to form the first spacers 108 is, for example, performed by a reactive ion etching (RIE) process. In an embodiment, the high temperature oxide layer 106 and a part of the exposed pad layer 102 located between two adjacent first spacers 108 may be removed in the RIE process to form a pad layer 102a.

Figure 1C:
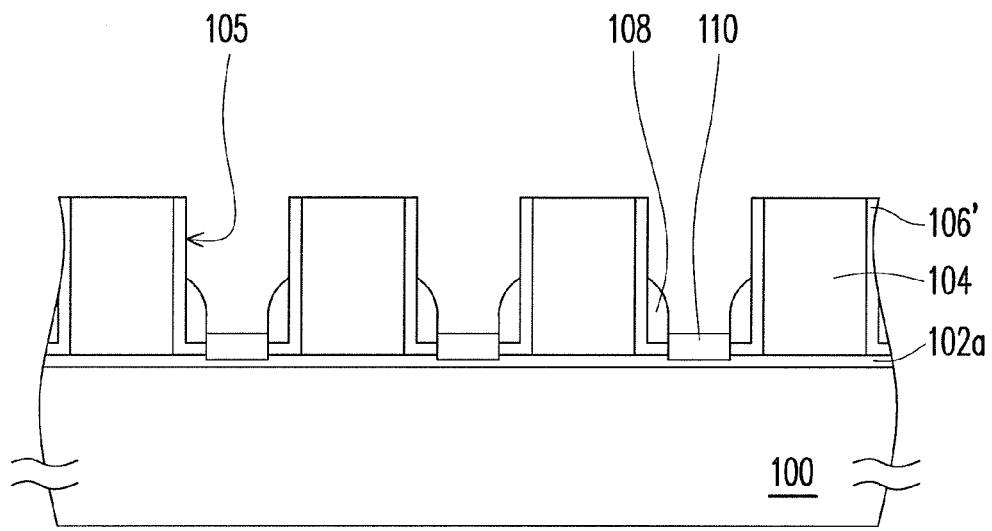

Referring to FIG. 1C, in an embodiment, an oxide layer (not shown) could be formed entirely on the substrate 100 by in-situ steam generation (ISSG) followed by a wet dip process to remove the foregoing oxide layer. The wet dip process removes not only the oxide layer formed by in-situ steam generation but also the oxide on the top surface of the patterned mask layer 104 to form a high temperature oxide layer 106'. The solvent utilized in the wet dip process is, for example, HF. It is noted that the anisotropic etching process for forming the first spacers 108 may damage the pad layer 102a or the first spacers 108. For this reason, forming the oxide layer on the substrate 100 by more active in-situ steam generation and then removing the oxide by the wet dip process can remove the material damaged in the prior process, so as to avoid the defects in later process. Afterward, a gate dielectric layer 110 is formed on the substrate 100. The gate dielectric layer 110 is formed between two adjacent first spacers 108 in the openings 105. The material of the gate dielectric layer 110 can be silicon oxide, which is formed by oxidation method.

Figure 1D:
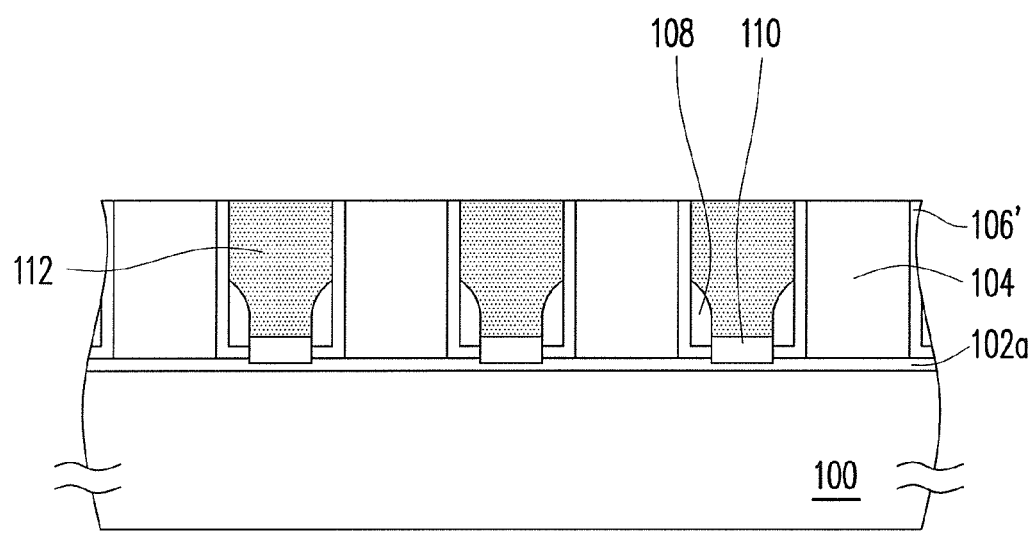

Referring to FIG. 1D, a conductive layer 112 is formed on the substrate 100, and the conductive layer 112 at least fills the openings 105 and covers the first spacers 108. The material of the conductive layer 112 is, for example, doped polysilicon, which may be formed by CVD. Then, a planarization process is performed on the conductive layer 112 to substantially equalize the top surface of the conductive layer 112 and that of the patterned mask layer 104, so that the gate structures are formed. The planarization process can be performed by chemical mechanical polishing (CMP) using the patterned mask layer 104 as a polishing stop layer.

Figure 1E:
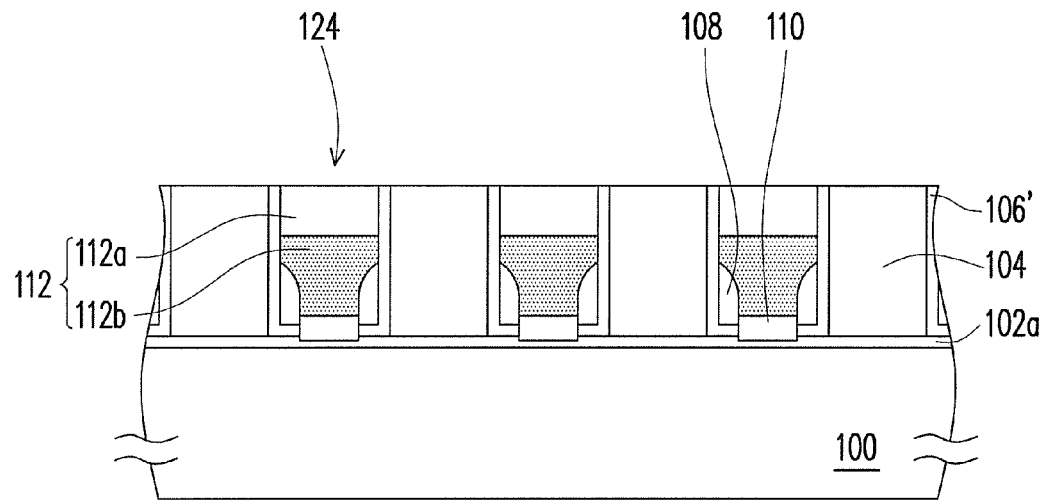

Referring to FIG. 1E, in an embodiment, an oxidation process could be performed optionally to turn a portion of the conductive layer 112 into oxide. During the oxidation process, only the upper part of the conductive layer 112 is oxidized to form cap layers 112a. On the other hand, the lower part of the conductive layer 112 which is not oxidized is still the original conductive material and serves as the control gates 112b. Each gate structure 124 of non-volatile memory includes the gate dielectric layer 110, the first spacers 108, the control gate 112b and the cap layer 112a.

Moreover, in an embodiment, another dielectric layer (not shown) may be directly formed on the top surface of the conductive layer 112 as the cap layer, rather than turning the upper part of conductive layer 112 into oxide.

Figure 1F:
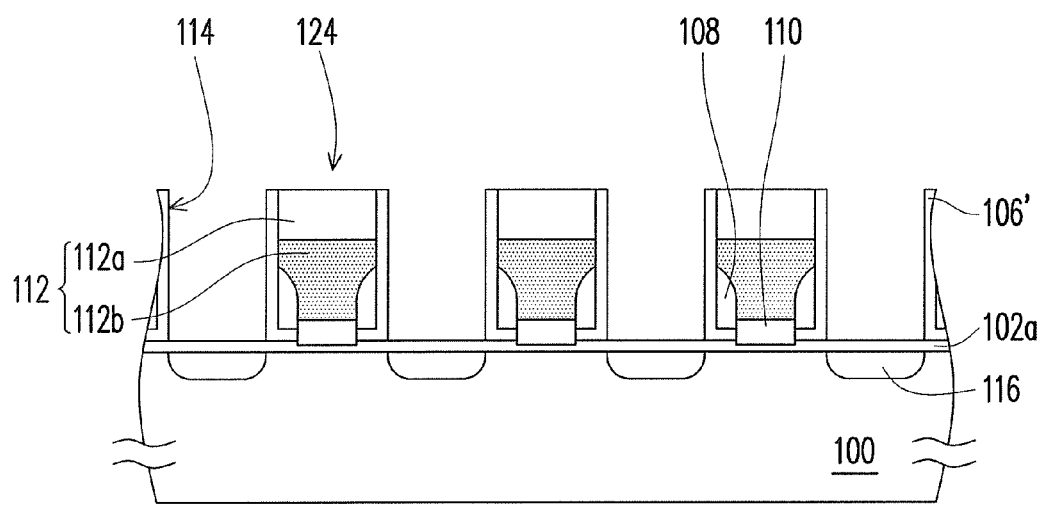

Referring to FIG. 1F, openings 114 are formed after the removal of the patterned mask layer 104. The method to remove the patterned mask layer 104 is either dry etching or wet etching. The high temperature oxide layer 106' disposed on the sidewalls of the gate structures 124 could protect the first spacers 108 and the control gates 112b during the removal of the patterned mask layer 104. Afterward, a doped region 116 is formed between two adjacent gate structures 124 on the substrate 100. The doped regions 116 are, for example, heavily doped area to work as a source or drain region of the non-volatile memory. The formation of the doped regions 116 is performed by ion implantation using gate structures 124 as a mask.

Figure 1G:
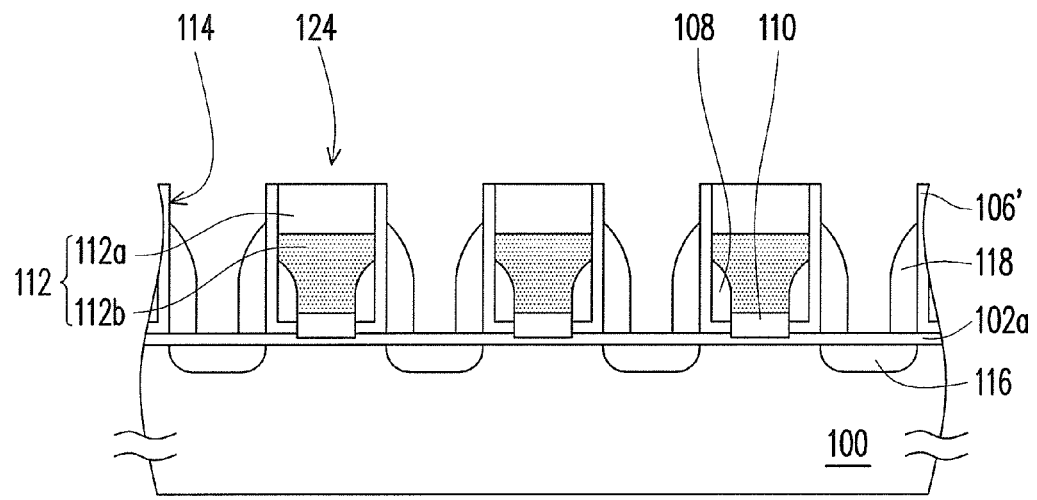

Referring to FIG. 1G, second spacers 118 are formed on the sidewalls of the gate structures 124 in the openings 114. The material of the second spacers 118 can be silicon nitride. The formation of the second spacers 118 is implemented by depositing a spacer material layer (not shown) that fills the openings 114 on the substrate 100 by CVD, and then removing a part of the spacer material layer by an anisotropic etching process. Therefore, second spacers 118 are formed on the sidewalls of the high temperature oxide layer 106'.

Figure 1H:
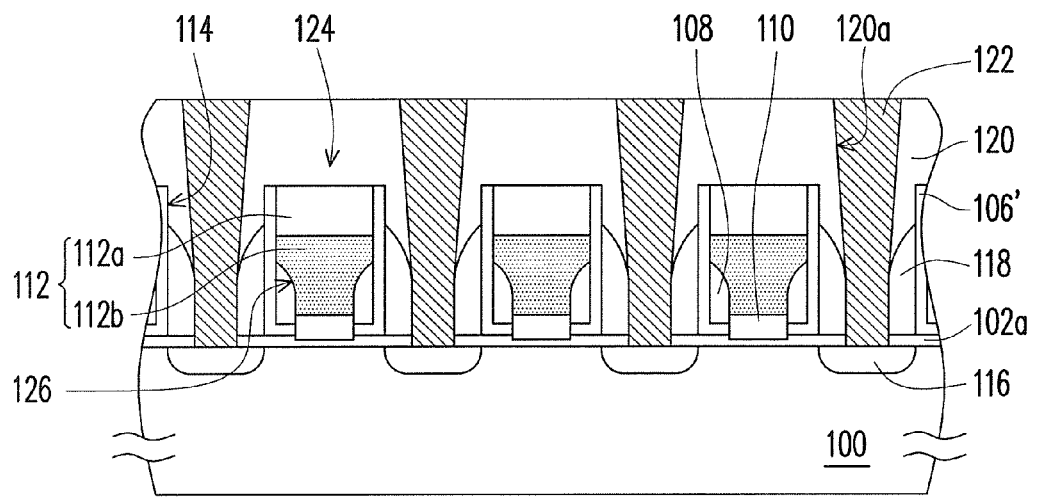

Referring to FIG. 1H, a dielectric layer 120 is formed on the substrate 100. The dielectric layer 120 at least fills two adjacent second spacers 118 in the openings 114 and covers the gate structure 124, for example. The material of the dielectric layer 120 is chosen to have different etching selectivity from the material of second spacers 118, such as silicon oxide. Then, contact openings 120a are formed after the removal of partial dielectric layer 120 and partial pad layer 102a. The contact openings 120a are formed between two adjacent second spacers 118 above the doped region 116. The fabrication of the contact openings 120a may be carried out by photolithography and etching processes in sequence. Owing to the different etching selectivities of the dielectric layer 120 and the second spacers 118, the contact openings 120a are self-aligned contact (SAC) openings. It is noted that even if the mis-alignment situation occurs during the removal of partial dielectric layer 120 to form the contact openings 120a, deployment of the second spacers 118 on the sidewalls of gate structures 124 can prevent the gate structures 124 from being damaged. Then, the contact openings 120a are filled with a conductive material layer to form a contact plug 122 between two adjacent second spacers 118. The material of contact plugs 122 may be W, Cu, Al or other proper metal.

The manufacturing process of the non-volatile memory mentioned in above embodiment is a gate last process. The gate structures 124 are defined by the openings 105 of the patterned mask layer 104, and then the first spacers 108 and the control gates 112b are formed in the openings 105, followed by the second spacers 118 and the contact plugs 122 between two adjacent second spacers 118 are formed after the removal of the patterned mask layer 104. It is helpful to scale down the size of each memory cell by utilizing CMP process to planarize the conductive layer in the openings 105 so as to form the control gates 112b. Moreover, defects formed in process mistake like mis-alignment mistake can be avoided by forming the self-aligned contact between two adjacent second spacers 118, so that the quality of device is ensured.

The following explanation focuses on the non-volatile memory of this invention using the structure shown in FIG. 1H as an example.

Referring to FIG. 1H, the non-volatile memory includes the gate structures 124, the doped regions 116, the second spacer 118 and the contact plugs 122. The gate structures 124 are disposed on the substrate 100. The doped regions 116 are disposed in the substrate 100 between two adjacent gate structures 124. The second spacers 118 are disposed on the sidewalls of the gate structures 124. The contact plugs 122 are disposed between adjacent second spacers 118, respectively.

The substrate 100 may be a semiconductor substrate, such as N- or P-type silicon substrate, III-V semiconductor substrates. The pad layer 102a is, for example, disposed on the substrate 100. The pad layer 102a is disposed between the gate structures 124 and the substrate 100, and more precisely, between the second spacers 118 and the substrate 100. The material of the pad layer 102a may be silicon oxide. In an embodiment, the dielectric layer 120 is disposed on the substrate 100. The dielectric layer 120 covers the gate structures 124 and the second spacers 118. The contact plugs 122 are, for example, disposed in the dielectric layer 120. The material of the dielectric layer 120 can be silicon oxide.

Each gate structure 124 includes the control gate 112b, the gate dielectric layer 110 and two first spacers 108. The control gate 112b is disposed on the substrate 100, and there are two recesses 126 formed at both sides of the control gate 122b. In other words, the top area of the control gate 112b is larger than the bottom area thereof, and the recesses 126 may be disposed at the lower portion of the control gate 112b, which is near the gate dielectric layer 110. The material of the control gate 112b can be doped poly-silicon. The gate dielectric layer 110 is disposed between the control gate 112b and the pad layer 102a. The material of the dielectric layer 110 is, for example, silicon oxide. The first spacers 108 are disposed in the recesses 126, respectively. In an embodiment, the first spacers 108 contact the control gate 112b. The material of the first spacers 108 could be charge-trapping material which makes charge be trapped, such as silicon nitride, tantalum silicon oxide, strontium silicon titanate, or hafnium silicon oxide. In an embodiment, the gate structures 124 even includes the cap layers 112a disposed on the control gates 112b, respectively. The material of the cap layer 112a could be oxide, such as oxide of doped polysilicon.

In an embodiment, the non-volatile memory further includes the high temperature oxide layer 106' disposed between the gate structures 124 and the second spacers 118, and also between the first spacers 108 and the pad layer 102a. The high temperature oxide layer 106' disposed on the sidewalls of the gate structures 124 can protect the first spacers 108 and the control gates 112b.

The second spacers 118 are disposed on the pad layer 102a above the doped regions 116. In an embodiment, the etching selectivity of the second spacers 118 differs from that of the dielectric layer 120. The material of the second spacers 118 may be silicon nitride.

The contact plugs 122, such as self-aligned contact plugs, are disposed on the doped regions 116 between adjacent second spacers 118, and contact with the doped region 116, respectively. The material of the contact plugs 122 can be W, Cu, Al or other proper metal.

In view of the above, the fabricating method of the non-volatile memory in this invention utilizes the opening of the patterned mask layer to define the position of the gate structure to be formed. The first spacers and the conductive layer as the control gate are formed in the openings, and the conductive layer is then proceeded a planarization process. After the processes mentioned above, the size of memory cells can be decreased effectively. Moreover, the method of the present invention forms the second spacers on the sidewalls of the gate structure, and forms the self-aligned contact between adjacent second spacers. Therefore, the defects raised by process mistake can be avoided to guarantee the quality of device.

The memory cell of the non-volatile memory in the present invention has smaller size by disposing the recesses at both sides of the control gate and disposing the first spacer for storing charge in the recesses.

Furthermore, the non-volatile memory and thereof fabricating method thereof in the present invention are able to be applied into current semiconductor devices, especially for the embedded non-volatile memory process. The process can be integrated with current logic process. Hence, not only the process is simple, but the utilization of photo mask and the cost can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a non-volatile memory, comprising:
    providing a substrate;
    forming a patterned mask layer on the substrate, wherein the patterned mask layer has a plurality of openings;
    forming a plurality of first spacers on sidewalls of the patterned mask layer in the openings;
    forming a gate dielectric layer on the substrate between two adjacent first spacers in each of the openings;
    forming a conductive layer on the substrate, wherein the conductive layer at least fills the openings and covers the first spacers;
    planarizing the conductive layer, so as to form a plurality of gate structures;
    removing the patterned mask layer;
    forming a doped region in the substrate between two adjacent gate structure;
    forming a plurality of second spacers on sidewalls of gate structures; and
    forming a contact plug between two adjacent second spacers.

2. The method according to claim 1, before planarizing the conductive layer, further comprising performing an oxidization process, so that an upper portion of the conductive layer forms an oxide.

3. The method according to claim 1, after forming the patterned mask layer and before forming the first spacers, further comprising forming a high temperature oxide (HTO) layer conformally on the substrate.

4. The method according to claim 1, after forming the patterned mask layer and before forming the first spacers, further comprising:
    performing an in-situ steam generation (ISSG) process; and
    performing a wet dip process.

5. The method according to claim 1, wherein a method for forming the contact plug comprising:
    forming a dielectric layer on the substrate;
    forming a contact hole in the dielectric layer; and
    filling the contact hole with a conductive material layer.

6. The method according to claim 1, wherein an etching selectivity of the dielectric layer is different from an etching selectivity of the second spacers.

7. The method according to claim 1, wherein a top surface of the first spacers is lower than a top surface of the patterned mask layer.

8. The method according to claim 1, wherein the first spacers comprise a silicon nitride.

9. The method according to claim 1, wherein the second spacers comprise silicon nitride.

* * * * *